United States Patent [19]
Eydelman

[11] Patent Number: 6,023,166
[45] Date of Patent: Feb. 8, 2000

[54] MRI ANTENNA

[75] Inventor: Gregory I. Eydelman, West Hempstead, N.Y.

[73] Assignee: Fonar Corporation, Melville, N.Y.

[21] Appl. No.: 08/974,080

[22] Filed: Nov. 19, 1997

[51] Int. Cl.[7] .................................................. G01V 3/00
[52] U.S. Cl. ......................................... 324/318; 600/422
[58] Field of Search .................................. 324/318, 322, 324/300, 312, 314, 307, 309; 600/407, 421, 422

[56] References Cited

U.S. PATENT DOCUMENTS

| | | | |
|---|---|---|---|
| 4,354,499 | 10/1982 | Damadian | 128/653 |
| 4,534,358 | 8/1985 | Young | 128/653 |
| 4,608,991 | 9/1986 | Rollwitz | 128/653 |
| 4,635,643 | 1/1987 | Brown | 128/653 |
| 4,636,730 | 1/1987 | Bottomley | 324/318 |
| 4,733,190 | 3/1988 | Dembinski | 324/318 |
| 4,742,304 | 5/1988 | Schnall et al. | 324/318 |
| 4,774,468 | 9/1988 | Bydder | 324/318 |
| 4,784,146 | 11/1988 | Mancuso et al. | 324/318 |
| 4,793,356 | 12/1988 | Misic et al. | 324/318 |
| 4,887,038 | 12/1989 | Votruba et al. | 324/318 |
| 4,918,388 | 4/1990 | Mehdizabeh et al. | 324/322 |
| 4,920,318 | 4/1990 | Misic et al. | 324/318 |
| 4,926,866 | 5/1990 | Lee | 128/630 |

(List continued on next page.)

OTHER PUBLICATIONS

"Optimization of Receiver Coil Bandwidth by Inductive Coupling", L. Darrasse et al., Society of Magnetic Resonance in Medicine, Works in Progress, p. 1340 (Aug., 1990).
"Estimation of the SNR Loss Due to Inductive Coupling Loops", S.M. Wright, Society of Magnetic Resonance in Imaging, Book of Abstracts, vol. 2, p. 955 (Aug., 1989).
"Optimized RF Coils for Low Field MRI", C. Leussler et al., Society of Magnetic Resonance in Medicine, Book of Abstracts, vol. 2, p. 938 (Aug., 1989).
"Estimation of the SNR Loss Due to Inductive Coupling Loops", S. Wright, Society of Magnetic Resonance in Medicine, vol. 2, p. 955 (Aug., 1989).
"The Performance of Mutually–coupled Coils for Magnetic Resonance Signal Recovery", D.J. Gilderdale et al., Society of Magnetic Resonance in Imaging, Book of Abstracts, vol. 2, p. 956 (Aug., 1989).
"Magnetism and Metallurgy of Soft Magnetic Materials", C. Chen, Dover Publications, Inc., pp. 6–8 (1977).
"Electrical Fundamentals for Technicians", Second Edition, McGraw–Hill Book Company, pp. 128–130, 408–411.
"Inductive (Flux Linkage) Coupling to Local Coils in Magnetic Resonance Imaging and Spectroscopy", W. Froncisz et al., Journal of Magnetic Resonance 66, pp. 135–143 (1986).

*Primary Examiner*—Louis Arana
*Attorney, Agent, or Firm*—Morgan & Finnegan, LLP

[57] ABSTRACT

A radio frequency antenna for conducting magnetic resonance imaging studies of the breast region of a patient includes a tuned primary coil inductively coupled to two tuned secondary coils. Each secondary coil defines a region for receiving one of the breasts of the patient, and receives magnetic resonance signals emitted from each breast and the surrounding region of the patient. The primary coil can be connected to the receiving circuitry of the magnetic resonance imaging system. The magnetic resonance signals received by the secondary coils induce signals in the primary coil which are provided to the magnetic resonance imaging system for processing. The secondary coils, which preferably include two windings, each have a portion adjacent to the primary coil and a portion distanced from the primary coil. The portions of the secondary coils adjacent to the primary coils preferably lie in substantially the same plane as the primary coil, while the portion of the secondary coil distanced from the primary coil lies in a second plane intersecting the plane of the primary coil. A cushion arrangement for supporting an antenna, and a method for collecting magnetic resonance signals from the breast region of a patient, are also disclosed.

27 Claims, 9 Drawing Sheets

U.S. PATENT DOCUMENTS

| | | | |
|---|---|---|---|
| 5,003,265 | 3/1991 | Leussler | 324/318 |
| 5,024,229 | 6/1991 | Bryant et al. | 324/318 |
| 5,050,605 | 9/1991 | Eydelman et al. | 324/318 |
| 5,243,289 | 9/1993 | Blum et al. | 324/322 |
| 5,351,688 | 10/1994 | Jones | 128/653.5 |
| 5,363,845 | 11/1994 | Chowdhury et al. | 128/653.5 |
| 5,379,768 | 1/1995 | Smalen | 128/653.5 |
| 5,414,360 | 5/1995 | Westphal et al. | 324/318 |
| 5,416,413 | 5/1995 | Leussler | 324/318 |
| 5,575,287 | 11/1996 | Eydelman | 128/653.5 |
| 5,583,438 | 12/1996 | Eydelman et al. | 324/318 |
| 5,585,721 | 12/1996 | Datsikas | 324/318 |
| 5,602,557 | 2/1997 | Duerr | 324/318 |
| 5,623,927 | 4/1997 | Damadian et al. | 324/309 |
| 5,699,802 | 12/1997 | Duerr | 128/653.5 |
| 5,804,969 | 9/1998 | Lian et al. | 324/318 |

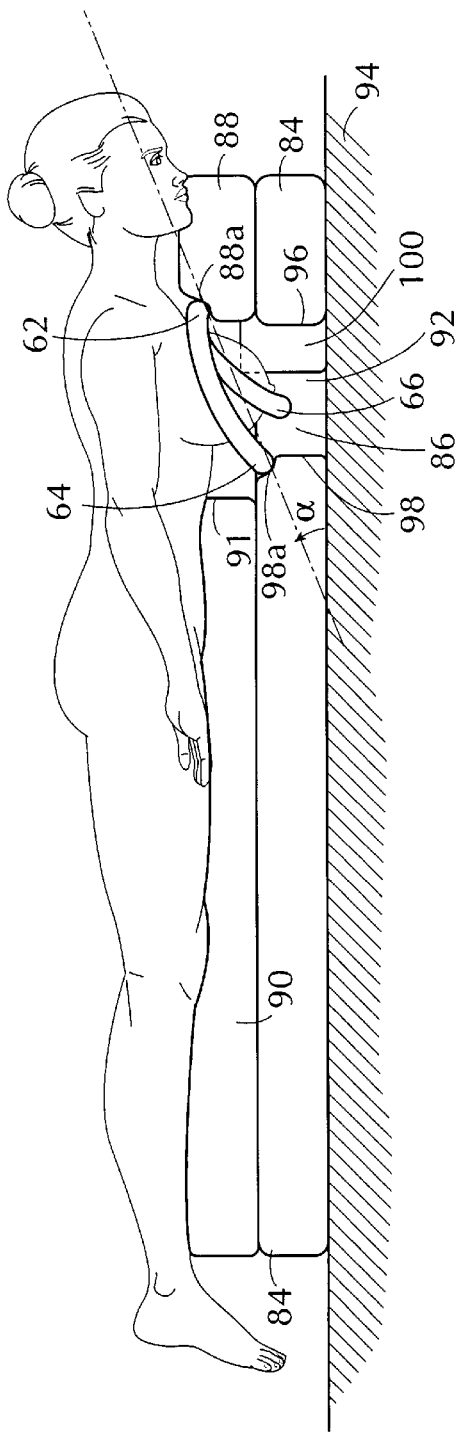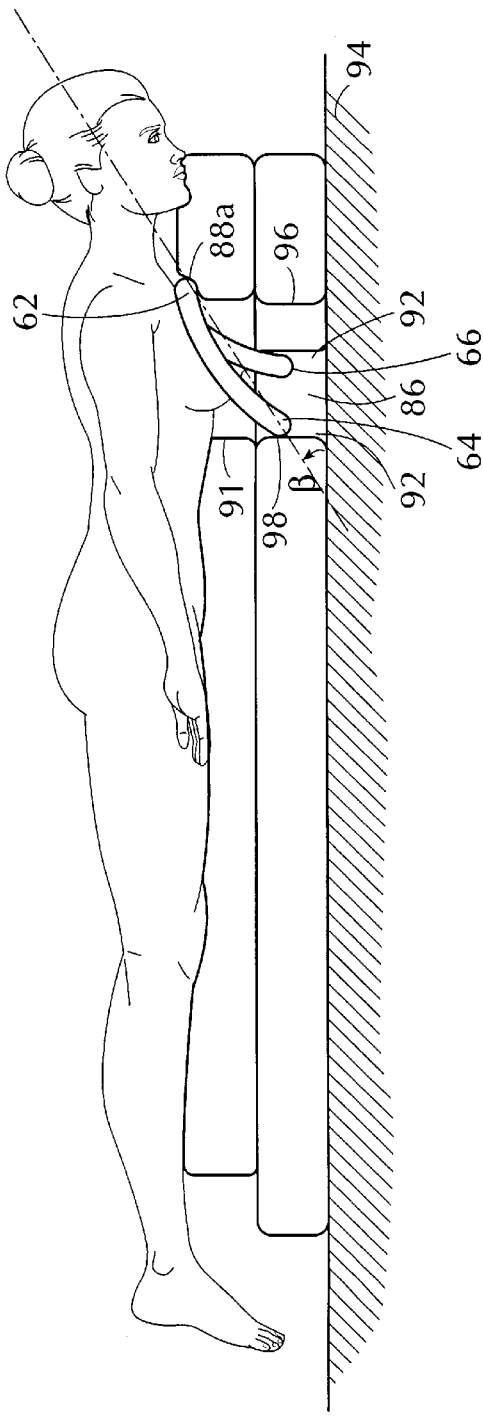

MRI ANTENNA

FIELD OF THE INVENTION

This invention relates to radio frequency antennas for use in magnetic resonance imaging. More particularly, this invention relates to radio frequency antennas for use in the magnetic resonance imaging of a woman's breasts. The antenna can be used to receive magnetic resonance imaging signals from the woman's breast and surrounding area, as well as to transmit radio frequency pulses to the patient.

BACKGROUND OF THE INVENTION

Magnetic resonance imaging ("MRI") is a well known, highly useful technique for diagnosing abnormalities in biological tissue. MRI can detect abnormalities which are difficult or impossible to detect by other techniques, without the use of x-rays or invasive procedures.

Magnetic resonance imaging uses changes in the angular momentum or spin of the atomic nuclei of certain elements within body tissue in a static magnetic field after excitation by radio frequency energy, to derive images containing useful information concerning the condition of the tissue. During a magnetic resonance imaging procedure, the patient is inserted into an imaging volume containing a static magnetic field. The vector of the angular momentum or spin of nuclei containing an odd number of protons or neutrons tends to align with the direction of the magnetic field. Irradiating the tissue within the imaging volume by a pulse or pulses of radio frequency energy having a particular bandwidth of frequency, referred to as the resonant or Larmor frequency, shifts the vectors of those nuclei out of alignment with the applied magnetic field. The spins of the nuclei then turn or "precess" around the direction of the applied primary magnetic field. As their spins precess, the nuclei emit small radio frequency signals, referred to as magnetic resonance ("MR") signals, at the resonant or Larmor frequency, which are detected by a radio frequency antenna tuned to that frequency. Gradient magnetic fields are provided to spatially encode the MR signals emitted by the nuclei. After the cessation of the application of radio frequency waves, the precessing spins gradually drift out of phase with one another, back into alignment with the direction of the applied magnetic field. This causes the MR signals emitted by the nuclei to decay. The MR signals are detected by a radio frequency receiving antenna positioned within the imaging volume proximate the patient, and are amplified, digitized and processed by the MRI system. Hydrogen, nitrogen-14, phosphorous 31, carbon 13 and sodium 23 are typical nuclei detected by MRI. Hydrogen is most commonly detected because it is the most abundant nuclei in the human body and emits the strongest MR signal.

The rate of decay of the MR signals varies for different types of tissue, including injured or diseased tissue, such as cancerous tissue. By known mathematical techniques involving correlation of the gradient magnetic field and the particular frequency of the radio frequency waves applied at various times with the rate of decay of the MR signals emitted by the patient, it is possible to determine the concentrations and the condition of the environment of the nuclei of interest at various locations within the patient's body. This information is typically displayed as an image with varying intensities, which are a function of the concentration and environment of the nuclei of interest. Typical MRI systems are the Quad 7000 and Quad 12000 available from FONAR Corporation, Melville, N.Y., for example.

The quality of the magnetic resonance image is directly related to the characteristics of the receiving antenna. Significant electrical characteristics of the antenna include sensitivity, Q factor and the signal-to-noise ratio.

Sensitivity is the signal voltage generated in the receiving antenna by MR signals of a particular magnitude. The higher the sensitivity within the region to be imaged, the weaker the signals which can be detected. The sensitivity of the antenna is preferably substantially uniform with respect to MR signals emanating from all volume elements within the region of the subject which is to be imaged.

The Q or quality factor, which is closely related to sensitivity of the antenna, is a measure of the ability of the antenna to amplify the received signal. The Q-value of the antenna can be lowered by a patient proximate or within an antenna, due to inductive coupling between the patient and the antenna. Antennas must therefore have a high Q-value when they are unloaded and the Q-value must not become too diminished by the presence of the patient. On the other hand, the coil must couple well with the region of a patient's anatomy which is to be imaged.

Signal-to-noise ratio is the ratio between those components in the electrical impulses appearing at the antenna terminals representing the detected MR signals, to the components representing spurious electromagnetic signals in the environment, and internally generated thermal noise from the patient. To optimize the signal-to-noise ratio, the antenna should have low sensitivity to signals from outside the region to be imaged. To enhance both signal-to-noise ratio and sensitivity, the antenna is "tuned" or arranged to resonate electrically at the frequency of the MR signals to be received, typically several megahertz or more. Neither the coil size nor geometry of the antenna can therefore create an inductance or self-capacitance which prevents tuning to the desired frequency.

The antenna must also meet certain physical requirements. The antenna should have a high filling factor, which maximizes the amount of tissue which fits within the volume detected by the windings of the coil. The antenna must also fit within the relatively small imaging volumes typically provided for receiving the subject within the magnet assembly, along with other components of the system and the subject. The antenna should not cause significant discomfort to the subject. Additionally, the antenna should be easy to position with respect to the subject, and be relatively insensitive to minor faults in positioning relative to the subject.

These numerous considerations often conflict with one another and together are a challenge to the antenna designer.

The sensitivity and signal-to-noise ratio of radio frequency antennas for use in MRI have been improved by providing a secondary coil, tuned to resonate at the Larmor frequency of the element of interest, for being positioned proximate the part of the subject which is to be imaged, and a similarly tuned primary coil, typically a single loop, for being positioned adjacent the secondary winding. The primary and secondary coils are inductively coupled to each other. The primary winding is connected to the pre-amplifier of the MRI system. MR signals emitted by the patient induce voltages in the secondary winding, causing current to flow within the winding. The current generates a magnetic field which induces voltage in the primary winding. The MR signals may be received by the primary coil, as well. The secondary and primary coils amplify the MR signals, and the primary coil filters spurious signals outside of the frequency band of the Larmor frequency. See, for example, U.S. Pat. No. 5,583,438 and U.S. Pat. No. 5,575,287, assigned to the assignee of the present invention.

One promising area of MRI is the diagnosis of breast cancer. MRI enables very accurate discrimination between healthy and cancerous tissue without the discomfort of more traditional techniques. In addition, MRI can be used to detect leakage of silicone from breast implants. While expensive, recent innovations can make MRI examination of the breast region of a patient economical. U.S. Pat. No. 5,490,513, for example, assigned to the assignee of the present invention, teaches a method and apparatus for increasing patient throughput, and hence the efficiency of the use of the MRI system, by providing multiple patient handling systems in an MRI system with multiple entrances to the imaging volume. In accordance with a method disclosed, while MRI is being conducted on a first patient inserted into the imaging volume on a first patient handling system through a first entrance, a second patient is being positioned and prepared for imaging on the second patient handling system. As soon as the imaging procedure is completed on the first patient, the second patient is inserted into the imaging volume through a second entrance and imaged, while a third patient is being prepared on the first or another patient handling system. A greater number of patients can thereby be imaged in a limited period of time.

Tumors can be located both in the breast tissue and in the chest wall surrounding and underlying the breast. The ability to detect tumors in the chest wall in addition to the breast tissue, depends in part on the ability of the radio frequency antenna used in the imaging process to accurately detect MR signals from the chest wall. It has also been found that MRI of the breasts is best performed with the patient in a prone position and the breasts hanging without restraint. The antenna therefore needs to be close enough to the breast tissue to adequately couple to the tissue, without compressing the breast tissue. A radio frequency antenna which uniformly detects MR signals from the breast tissue and chest wall, with low signal-to-noise ratio, without compressing the breasts would be advantageous.

SUMMARY OF THE INVENTION

In accordance with the present invention, an antenna for use in the magnetic resonance imaging of the breast region of a patient is disclosed having two tuned secondary coils inductively coupled to a primary coil. The secondary coils, which each define a region for receiving one of the breasts of the patient, receives magnetic resonance signals from the breast and surrounding region, including the chest wall. Voltage signals dependent upon the magnetic resonance signals detected by the secondary coils are induced in the primary coil. The primary coil provides the signals to a magnetic resonance imaging system for processing. The primary coil may detect magnetic resonance signals from adjacent tissue, as well. The coils are tuned to the resonant or Larmor frequency of an element of interest, such as hydrogen.

Portions of the secondary coils lie in two different intersecting planes. The portion in one plane is adjacent and proximate to the primary coil to achieve good inductive coupling with the primary coil. Critical coupling is preferred. The portion in the other plane is distanced from the primary coil, and essentially extends the range of the antenna.

Preferably, the secondary coils include two windings. One winding is adjacent the primary coil. The other winding has one portion adjacent to or proximate the primary coil, and another portion distanced from the primary coil. The primary coil and the adjacent or proximate portions of the secondary coils preferably lie in a first plane while the portion of the secondary coil distanced from the primary coil lies in a second plane intersecting the first plane. The plane of the primary coil and adjacent portions of the secondary coils may be spherical.

A cushion arrangement for conducting magnetic resonance imaging of the pendulous breasts of a prone patient is also disclosed, including a base cushion having a cavity with opposed inclined side walls for supporting a portion of an antenna in a plurality of positions. A head cushion with a recess for supporting a top portion of the antenna is provided forward of the cavity. A body cushion is provided rearward of the cavity. An additional cushion may be provided within the cavity to further support the antenna.

A method of collecting magnetic resonance signals from the breast region of a patient is also disclosed wherein the breasts of a patient are received within first and second coils of an antenna. The breast region of the patient is irradiated to excite the emission of magnetic resonance signals, which are simultaneously received by the first and second coils. The first and second coils induce signals in a third coil inductively coupled to the first and second coils. The induced signals are transmitted from the third coil to the receiving circuitry of an MRI system.

BRIEF DESCRIPTION OF THE DRAWINGS

FIGS. 10 and 11 are side views of the cushions of FIG. 9, supported on a bed, with a portion removed to show the preferred placement of the antenna with respect to a large breasted woman and small breasted woman, respectively;

DETAILED DESCRIPTION OF THE INVENTION

Figure 1:
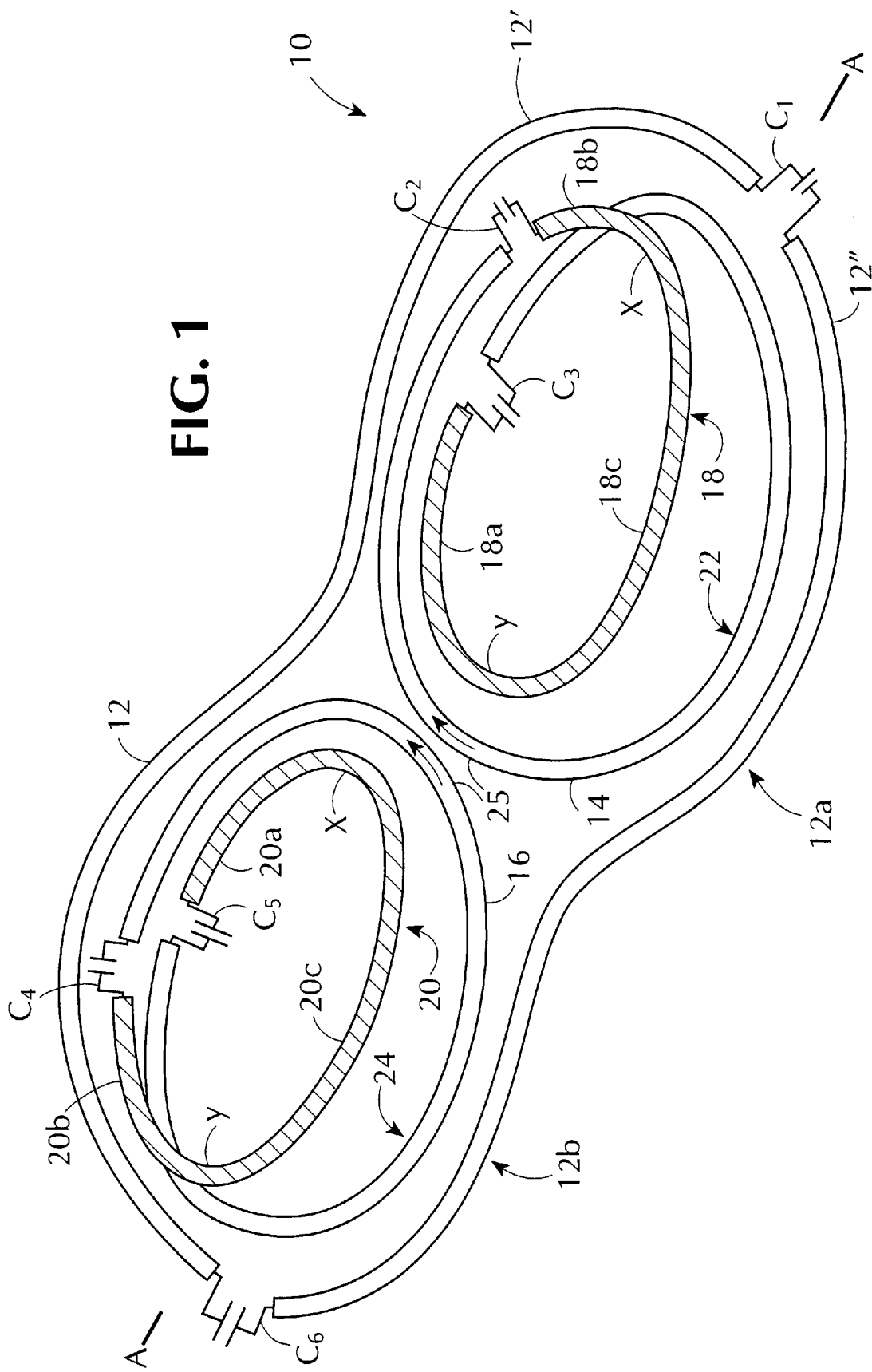
FIG. 1 is a top view of a schematic representation of a radio frequency antenna 10 in accordance with the present invention, for use in magnetic resonance imaging of the breast region of a patient.

FIG. 1 is a top view of a schematic representation of a radio frequency antenna 10 for use in magnetic resonance imaging ("MRI") of the breast region of a patient in accordance with the present invention. The antenna 10 has a tuned primary circuit or coil 12 inductively coupled to two tuned secondary circuits or coils 14, 16. The primary coil 12 is elongated along an axis of elongation A—A to accommodate the secondary coils 14, 16. The secondary coils 14, 16 are adjacent to each other along the axis A—A. Preferably, the primary coil 12 has two elliptical shaped sections 12a, 12b. The major axes of each of the elliptical sections lies generally in the direction of the axis A—A. One secondary coil 14 lies within the right elliptical shaped section 12a of the primary coil 12 and the other secondary coil 16 lies within the left elliptical shaped section 12b.

The primary coil 12 includes at least one primary inductor and at least one primary capacitor connected in series to form a loop. The primary coil 12 is preferably formed of two primary coil segments 12', 12", which are inductors, connected in series by two capacitors $C_1$, $C_6$. Multiple coil segments are preferred to lower the inductance of the resulting coil. Otherwise, it may be difficult to tune the coil 12 to resonate at the Larmor frequency of the element of interest in MRI systems at higher magnetic field strengths. In addition, it is believed that the decrease in direct current flow due to the presence of two or more capacitors in the circuit decreases the sensitivity of the antenna 10 to eddy currents generated by the gradient magnetic field of the MRI system.

The secondary circuits or coils 14, 16 are each spiral coils forming closed loops. Preferably, the secondary coils 14, 16 each have two windings. The secondary coils 14, 16 include at least one secondary inductor and at least one secondary capacitor connected in series. The secondary coils 14, 16 are also preferably formed of two secondary coil segments 18, 20 and 22, 24, having inductances and connected in series by capacitors $C_2$, $C_3$ and $C_4$, $C_5$, respectively. It is preferred that the secondary coils 14, 16 be formed of multiple coil segments connected by capacitors, for the reasons described above with respect to the primary coil 12. The coil segments 18, 20 form first windings 18, 20, and the coil segments 22, 24 form second windings 22, 24. The first windings 18 and 20 are shaded in FIG. 1 to ease identification.

Each of the secondary coils 14,16 has portions in two different planes. One portion is adjacent and parallel to the primary coil 12 to inductively couple the secondary coils 14,16 to the primary coil 12. Another portion is distanced from the primary coil 12, to increase the filling factor of the antenna 10. In the example of FIG. 1, portions 18c, 20c of the first windings 18, 20, which extends between point x and point y on the first windings 18, 20, are distanced from the primary coil 12. The remaining portions 18a, 18b and 20a, 20b of the first windings, and significant portions of the second windings 20, 24 lie in a different plane than the portions 18c, 20c and are adjacent and parallel to, or at least proximate to, the primary coil 12. The adjacent, proximate and parallel spacing of the coils is best shown in FIG. 3.

Figure 2:
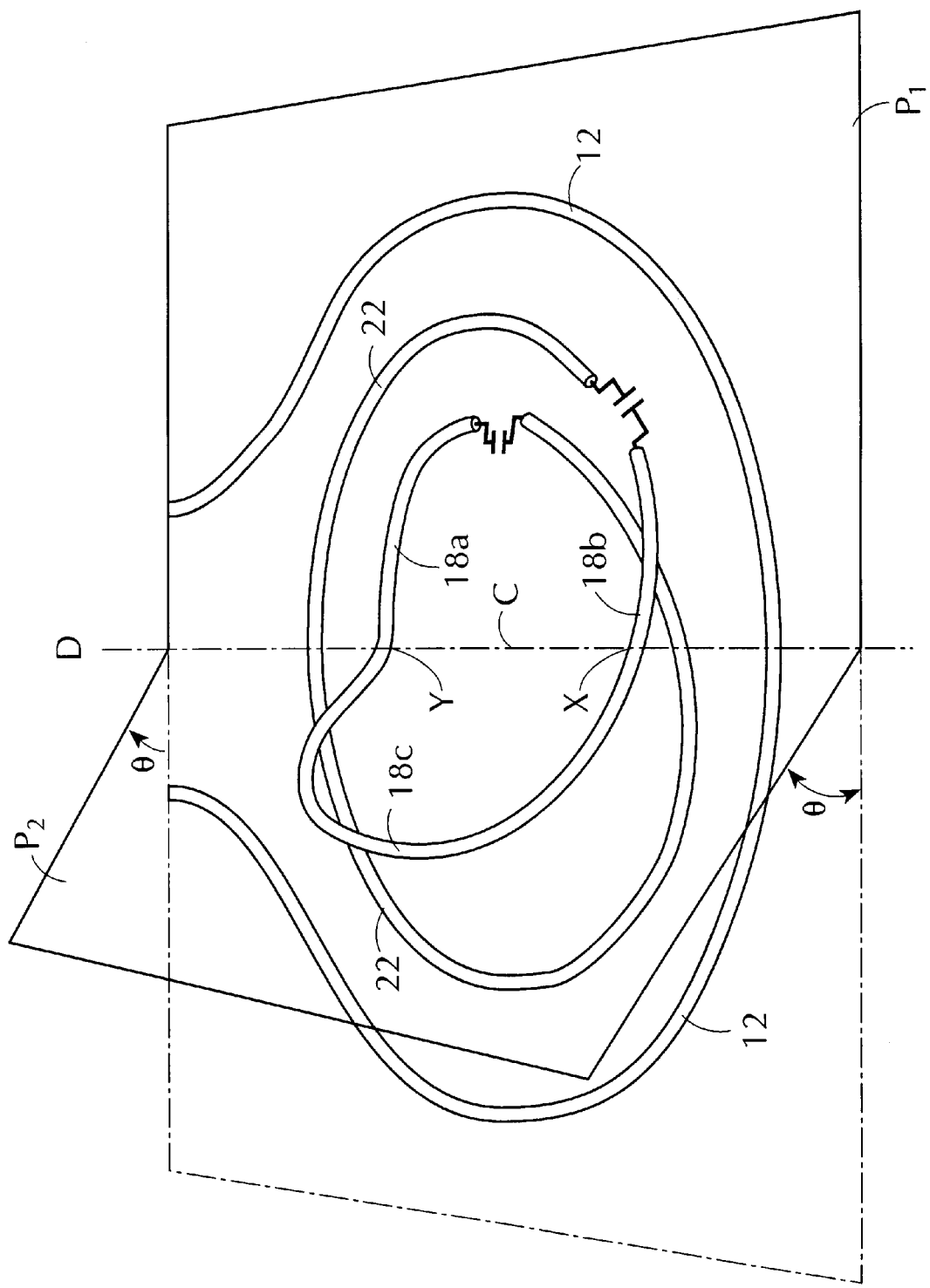
FIG. 2 is a side perspective view of the right side of the antenna 10 of FIG. 1, identifying a first plane P1 and a second plane P2.

FIG. 2 is a side perspective view of the right side 12a of the primary coil 12 and the secondary coil 14, of the schematic representation of the antenna 10 of FIG. 1, superimposed on a first plane P1 and a second plane P2 which intersects the first plane P1 at an angle θ, to illustrate the planar relationship between the coils in this embodiment of the invention. The second winding 22 lies substantially in the first plane P1. The portion 18c of the first winding lies substantially in the second plane P2. Portions 18a and 18b of the first winding 18 lie substantially within the first plane P1. To position the portions of the first winding 18 in their respective planes, the first winding 18 is folded along a chord C which lies along an axis D and extends between points x-y on the first winding 18. The axis D lies generally in the direction of the axis of elongation A of the primary coil, shown in FIG. 1. The primary coil 12 preferably lies substantially in the first plane P1, as well. An angle θ of about 30° between the first plane P1 and the second plane P2 is preferred. The capacitor $C_1$ of the primary coil 12 is omitted in this view. The secondary coil 16 is a mirror image of coil 14. Therefore, portions 20a, 20b of the first winding 20, and the second winding 24 lie substantially in a first plane while portion 20c, which extends between points x and y, lies substantially in second plane.

Since the two secondary circuits 14, 16 are mirror images of each other, magnetic resonance ("MR") signals picked up by the secondary coils 14, 16 induce voltages which cause current to flow in opposite directions in each coil 14, 16. The current flowing in adjacent portions of the two secondary coils 14, 16, therefore, flow in the same direction, as indicated by the arrows 25 in FIG. 1. The interference between the secondary circuits 14, 16 is thereby minimized, obviating the need for shielding between the circuits, even though the secondary coils 14, 16 are slightly inductively coupled, and enabling the detection of MR signals from both breasts simultaneously. The direction of the current in FIG. 1 is exemplary. The current can flow in either direction dependent on the direction of the first windings 18, 20 and second windings 22, 24 and the direction of the applied magnetic field.

Figure 3:
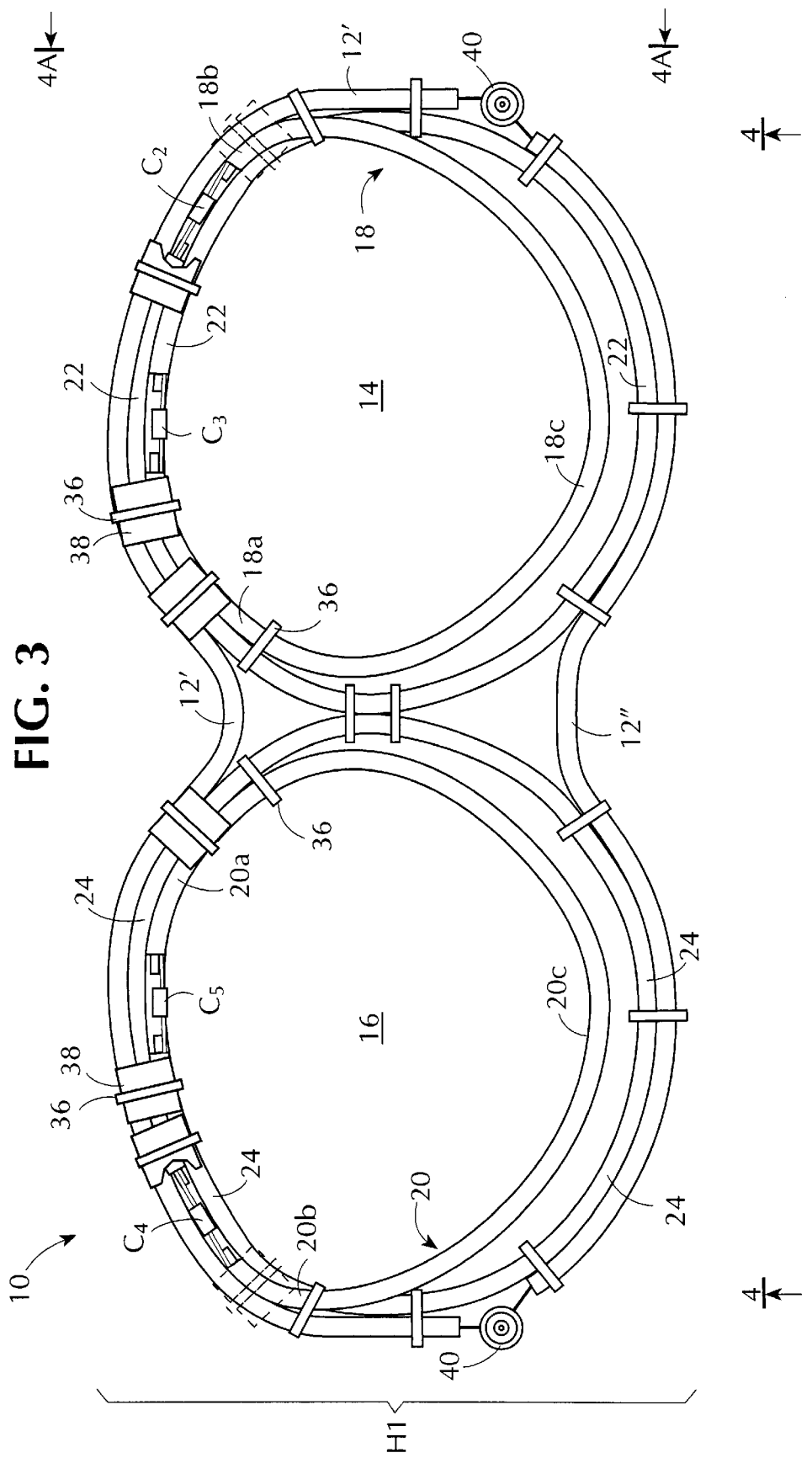
FIG. 3 is a top view of an antenna 10 in accordance with the present invention, showing the positioning of the antenna windings.
Figure 4:
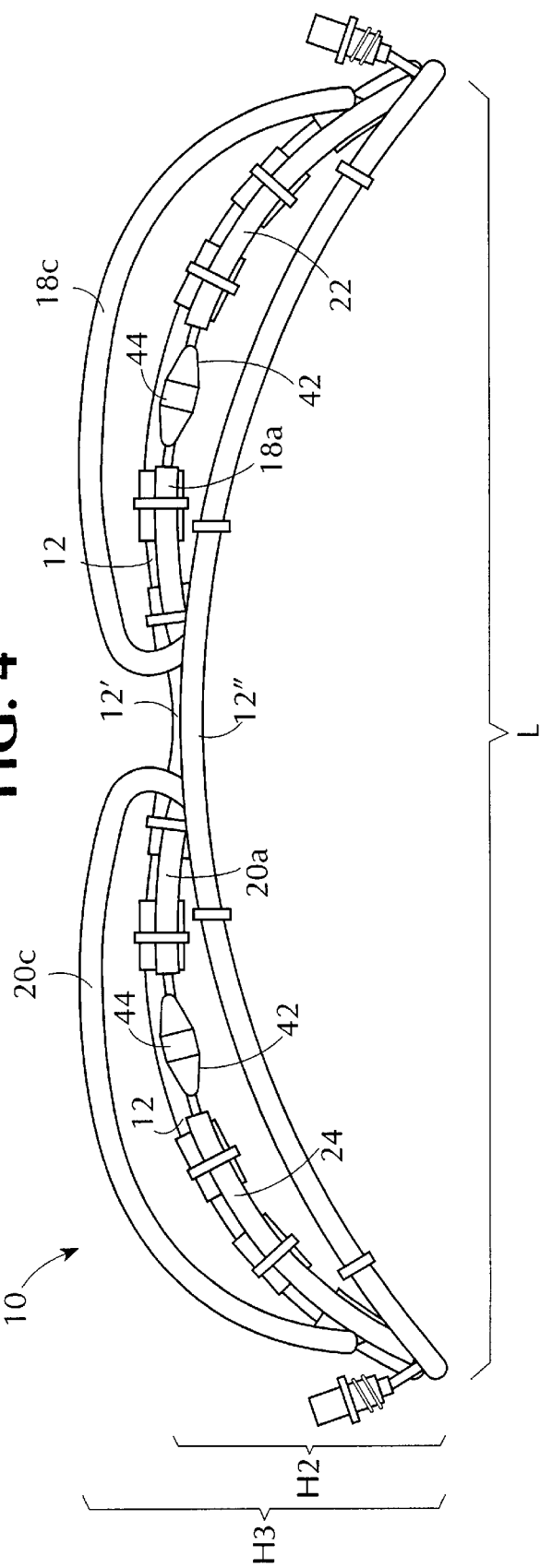
FIG. 4 is a view of the antenna of FIG. 3 along line 4—4.
Figure 4A:
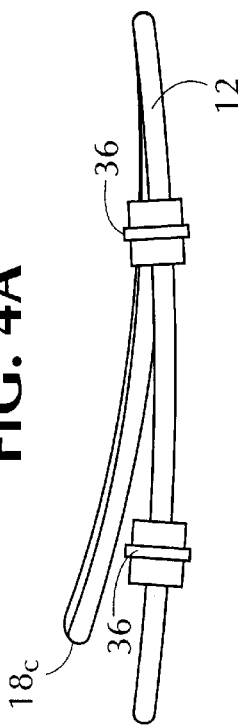
FIG. 4A is a view of the antenna of FIG. 3, along line 4A—4A.

FIG. 3 is a top view of the positioning of the coils in an antenna 10 in accordance with a preferred embodiment of the present invention. FIG. 4 is a view of the antenna 10 along line 4—4 in FIG. 3. FIG. 4A is a view of the antenna 10 along line 4A—AA of FIG. 3. The primary coil segments 12', 12" and the secondary coil segments 18, 20 and 22, 24 are contained within insulative tubing. The number of the tubing corresponds to the number of the winding contained within the tubing, as identified in FIG. 1. The coil segments can be solid wires or hollow tubes of a suitable conducting material, such as copper. Teflon® is a preferred insulative tubing material. Copper is a preferred conducting material.

The capacitors $C_2$, $C_3$, $C_4$ and $C_5$ connecting the wire segments of the secondary coils 14, 16, are shown in FIG. 3. The wire segments 12', 12" of the primary coil 12 are connected to two BNC coaxial connectors 40. The capacitors $C_1$ and $C_6$, which are not shown in this view, are connected to the BNC connectors 40.

The primary coil 12 is preferably approximately critically coupled to each of the secondary coils 14, 16. Overcoupling has been found to produce multiple resonances. To achieve the preferred degree of coupling between the primary coil 12 and the secondary coils 14, 16, the primary coil 12 is immediately adjacent to or proximate the first or second windings of each of the secondary coils 14, 16, along a substantial portion of its length. The portions of the secondary coils adjacent and proximate to the primary coil 12 substantially follow the elliptical shape of the primary coil 12, such that the adjacent and proximate portions of the primary coils 12 and secondary coils 14, 16 are parallel to each other.

FIG. 3 shows portions of the second windings 22, 24 adjacent to the primary coil segment 12". Portions of the second winding 22, 24 are also adjacent to portions of the primary coil segment 12'. Portions 18a, 20a of the second winding are adjacent to the second windings 22, 24, respectively, and proximate the primary coil segment 12'. Portions 18b, 20b of the second windings 18, 20, respectively, are also adjacent to other portions of the primary coil 12'. In those areas, portions of the second windings 22, 24 are adjacent to portions 18b, 20b, and proximate the primary coil segment 12'. In the view of FIG. 3, the second portions 18c, 22c of the first windings 18, 22 of each of the secondary coils 14,16 in the second plane extend out of the page.

Figure 6:
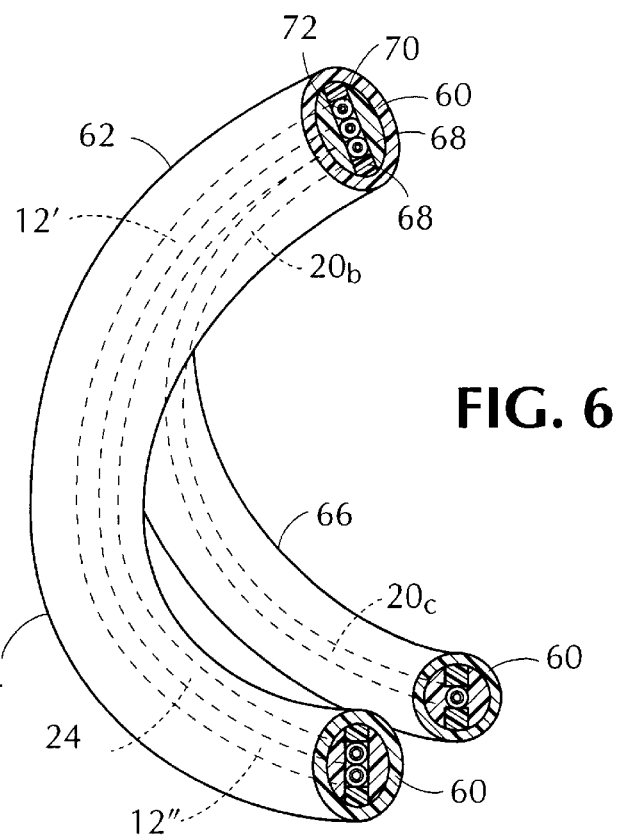
FIG. 6 is a cross-sectional view of antenna 10, through line 6—6 in FIG. 5.

The coil segments are preferably hollow copper tubing with an outer diameter of about 0.125 inches. Adjacent coil segments are preferably about 0.125 inches apart to achieve the preferred critical coupling. FIG. 6 includes a cross-sectional view of the insulative tubing 70 and copper tubing 72.

Returning to FIG. 3, adjacent portions of the tubing 32 are held together by plastic ties 36. Where three tubes 32 are adjacent each other, plastic plates 38 secured by the ties 36 are used to maintain the tubes in the same plane. The height H1 of the antenna, as measured from the top of the first primary coil segment 12' to the bottom of the second primary coil segment 12" is about 8 inches.

FIG. 4 is a view of the antenna 10 taken along line 4—4 in FIG. 3. The second portions 18c, 20c of the first windings 18, 20 are shown, distanced from the primary wire segment 12". The primary coil 12 is preferably curved to follow the contour of the chest. The first plane P1 containing the primary coil 12 is, therefore, preferably a curved plane. Curving the primary coil 12 improves the reception of MR signals from the breast region, particularly in the chest and the outer sides of the breasts. The curvature of the primary coil 12 is preferably about 11.5 R. The length "L" of the antenna is about 16 inches. The vertical height "H2" of the primary coil 12" as measured from the bottom edge of the antenna 10 in this view is about 3 inches. The vertical height "H3" of the second portions 18c, 20c of the winding 18, 20 as measured from the bottom edge of the antenna 10 is about 4.5 inches.

The secondary coils 14, 16 preferably substantially follow the curvature of the primary coil 12, such that the second windings 22 and the portions 18a, 18b and 20a, 20b of the first windings, respectively, lie substantially within the same curved first plane as the primary coil 12. The bottom portions of the second windings 22, 24 shown in FIG. 3, are therefore obscured in the view of FIG. 4 by the primary wire segment 12". The windings 22 and 18a of the secondary coil 14 and windings 24 and 20a of the secondary coil 16, substantially obscure the portions of the second windings 22, 24 behind them, respectively, in this view. In addition, the capacitors $C_3$, $C_4$ are shown covered by a protective layer of foam 42, wrapped around the capacitors and secured by ties 44. The foam, or other such soft material, should not contain carbon. The foam protects the capacitors during handling.

FIG. 4A is a side view of the antenna of FIG. 4 taken along line 4A—4A of FIG. 3. The primary coil 12 has a curvature transverse to the axis of elongation A, which is a consequence of curving the antenna 10 to provide the curvature shown in FIG. 4. The curvature is about 11.5 R. Since the curvature of the primary coil along the axis of elongation is also about 11.5 R, the primary coil 12 and the adjacent and proximate parts of the coils 14, 16 lie substantially on a spherical plane. As in FIG. 4, interior windings are obscured by the primary coil 12 in this view. The BNC connector 40 is not shown in this view.

It has been found to be easier to assemble the antenna if the primary coil 12 and the adjacent portions of the secondary coils 14, 16 lie in the same plane. However, as long as sufficient portions of the primary and secondary coils are adjacent and/or sufficiently proximate to each other to achieve the desired degree of coupling, the primary coil 12 and portions of the secondary coils 14, 16 need not be in the same plane. In either case, portions 18c, 20c of the secondary coils are distanced from the primary coil 12, to increase the filling factor of the antenna 10.

After assembly of the tubing, the tubing is covered by layers of foam about 0.25 inches thick, The antenna 10 is then covered with an electrically insulative, soft coating, such as rubber, plastic, or vinyl. The material should have a high dielectric strength to minimize capacitative losses by the antenna 10. A dielectric strength of at least about 400 volts/mil is preferred. Buellidyne I, a rubber type material, may be used, for example. Buellidyne I can be applied by spray or dipping by Contour Fabricators, Inc., Grand Blanc, Mich., for example. A layer of about 0.125 inches is sufficient.

Figure 5:
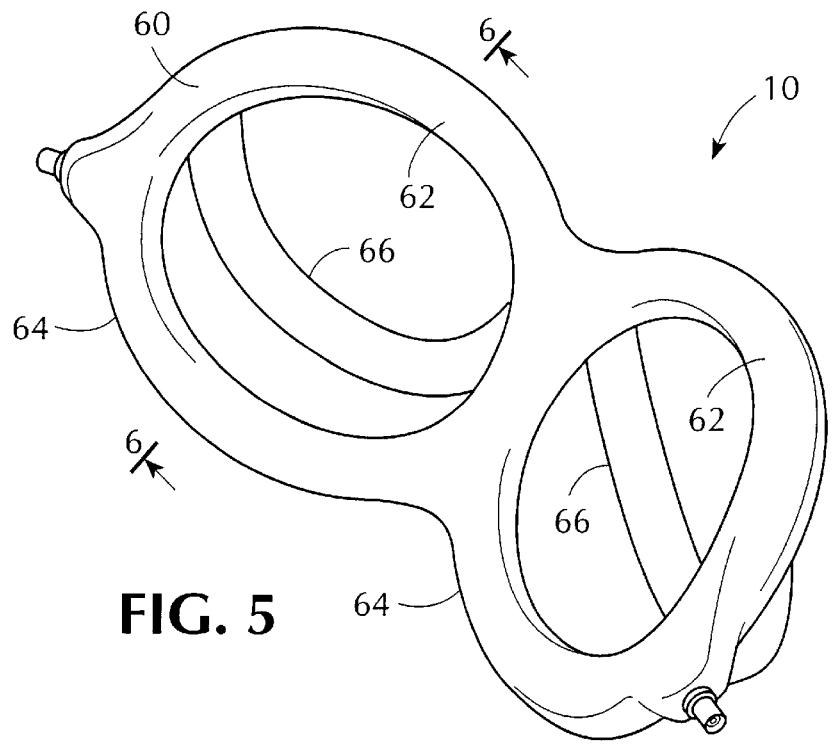
FIG. 5 is a rear, upper perspective view of the radio frequency antenna 10 in accordance with the present invention, covered with an insulative coating.

FIG. 5 is a rear, upper perspective view of the fully assembled radio frequency antenna 10 in accordance with the present invention. The antenna 10 has a top portion 62, a first depending loop 64 and a second depending loop 66. The top portion 62 includes the primary coil segment 12', and portions of the first and second windings of the secondary coils. The first depending loop 64 contains the primary coil 12 and the second windings 22, 24. The second depending loop 66 contains the portions 18c, 20c of the second winding 18, 20 of the secondary coils 14, 16, respectively.

FIG. 6 is a cross-sectional view of antenna 10, through line 6—6 in FIG. 5, showing the primary coil segments 12', 12", the second winding 24, the portion 20b of the first winding 18 and the portion 20c of the first winding 18. The outer insulative layer 60, foam 68, Teflon® tubing 70 and copper wires 72 are shown, as well.

Figure 7:
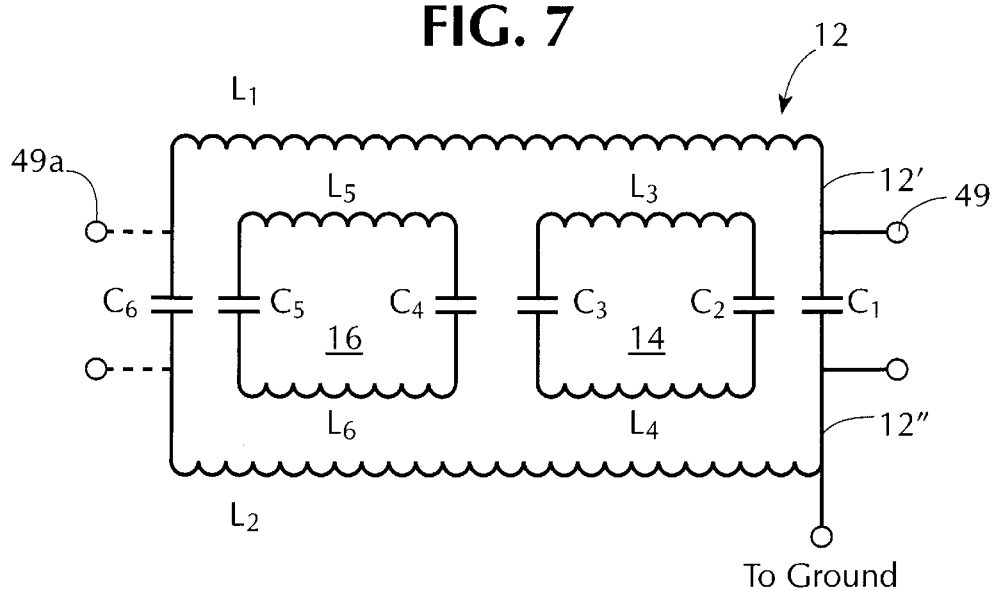
FIG. 7 is an electrical schematic of the antenna in accordance with the present invention.

FIG. 7 is an electrical schematic of the antenna 10 in accordance with the present invention. The coil segments of the primary circuit 12 in FIG. 1 are represented by two inductors $L_1$, $L_2$. The capacitors $C_1$, $C_6$ connect the inductors $L_1$, $L_2$ in series. The coil segments making up each of the secondary circuits 14, 16 are represented by the inductors $L_3$, $L_4$ and $L_5$, $L_6$, respectively. Capacitors $C_2$, $C_3$ connect the inductors $L_3$ and $L_4$ in series. The capacitors $C_4$ and $C_5$ connect the inductors $L_5$ and $L_6$ in series. The secondary circuits 14, 16 are inductively coupled to the primary circuit 12. As discussed above, two coil segments are preferably used in the primary circuit 12 and the secondary circuits 14, 16, to lower the inductance of the circuits. A port 49 shown in the form of a terminal pair is provided to permit the transfer of signals from the primary coil 12 to the MRI system. Typically, the port 49 is connected to the peamplifier of the MRI system, as discussed with respect to FIG. 8, below. An optional port 49a may also be provided to enable connection of the other side of the primary coil 12 to the MRI system. The port 49a also enables connection of the primary coil 12 to a source of radio frequency energy within the MRI system, if the antenna 10 is to be used as a transmitting antenna, as well. The primary circuit 12 is grounded, as well. The values of the capacitors are adjusted to tune the primary circuit 12 and secondary circuits 14, 16 to resonate at the Larmor frequency of the element of interest.

The resonant or Larmor frequency of an element of interest depends on the magnetic field strength of the magnet of the MRI system. Hydrogen is the most commonly detected element. For hydrogen imaging in an MRI system with a magnetic field strength of 3,500 Gauss, for example, the Larmor frequency is about 14.9 MHz. In a preferred configuration, the length of the primary coil segment 12" is preferably about 19 inches. The length of the primary coil segment 12" is preferably about 26 inches. The length of the first windings 18, 20 of the secondary coils 14, 16 is preferably about 20 inches and the length of the second windings 22, 24 is about 26 inches. The value of the capacitors $C_2$, $C_3$, $C_4$ and $C_5$ is 140 picofarads ("pf"); the value of $C_1$ is 33 pf; and $C_6$ is 80 pf. At 6,000 Gauss, the Larmor frequency of hydrogen is about 25.5 $MH_z$. In a preferred configuration, with the same coil and winding lengths as above, all the capacitors are 33 pf.

Figure 8:
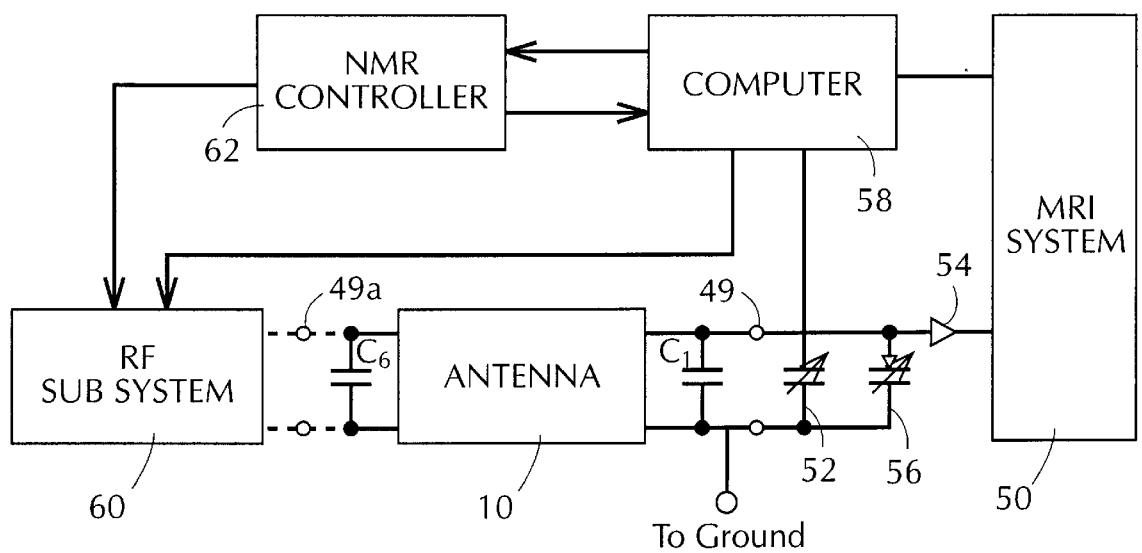
FIG. 8 is a schematic representation of the connection between the antenna of the present invention to an MRI system.

FIG. 8 is a schematic representation of the connection between the antenna 10 of the present invention to an MRI system 50. The antenna 10 is connected to the pre-amplifier 54 of the MRI system 50 through the port 49. As discussed above, the presence of a patient provides a load on the antenna 10 which lowers the antenna's Q. The presence of the patient also shifts the resonant frequency of the antenna 10 so that the antenna 10 may require returning to the desired Larmor frequency. A varactor, or variable capacitor 52 is therefore provided between the capacitor $C_1$ of the antenna 10 and the preamplifier 54 of the MRI system 50, parallel to the capacitor $C_1$. The varactor 52 enables retuning of the antenna 10 by varying the effective capacitance of capacitor $C_1$ when the antenna 10 is positioned with respect to the patient, as is known in the art. A back diode 56 is preferably provided parallel with the varactor 52 to prevent the passage of excessive voltage to the pre-amplifier 54, also as is known in the art. Voltage greater than about 0.7 volts is typically blocked by the back diode 56. The varactor 52 is controlled by the computer 58 of the MRI system 50. The port 49 may be connected to the varactor 52, back diode 56 and pre-amplifier through a short, low capacitance cable, or other appropriate means.

FIG. 8 also shows an optional connection between the capacitor $C_6$ and the antenna 10 and the RF subsystem 60 of the MRI system 50, through the optional port 49. The RF subsystem 60 is controlled by a nuclear magnetic resonance ("NMR") controller 62 and the computer 58 of the MRI system 50. A more complete description of the operation of the MRI system may be found in U.S. Ser. No. 08/880,721, assigned to the assignee of the present invention and incorporated by reference, herein. The RF subsystem 60 can also be connected to capacitor $C_1$ through a switch controlled by the computer 58. The computer 58 would switch the connection between the RF subsystem and the antenna 10, and the preamplifier 54 and the antenna 10, at appropriate times. Use of the antenna 10 as a transmitter is not preferred, however, because it has been found that the transmission of the radio frequency pulses is more uniform if the transmitter is further from the patient.

Figure 9:
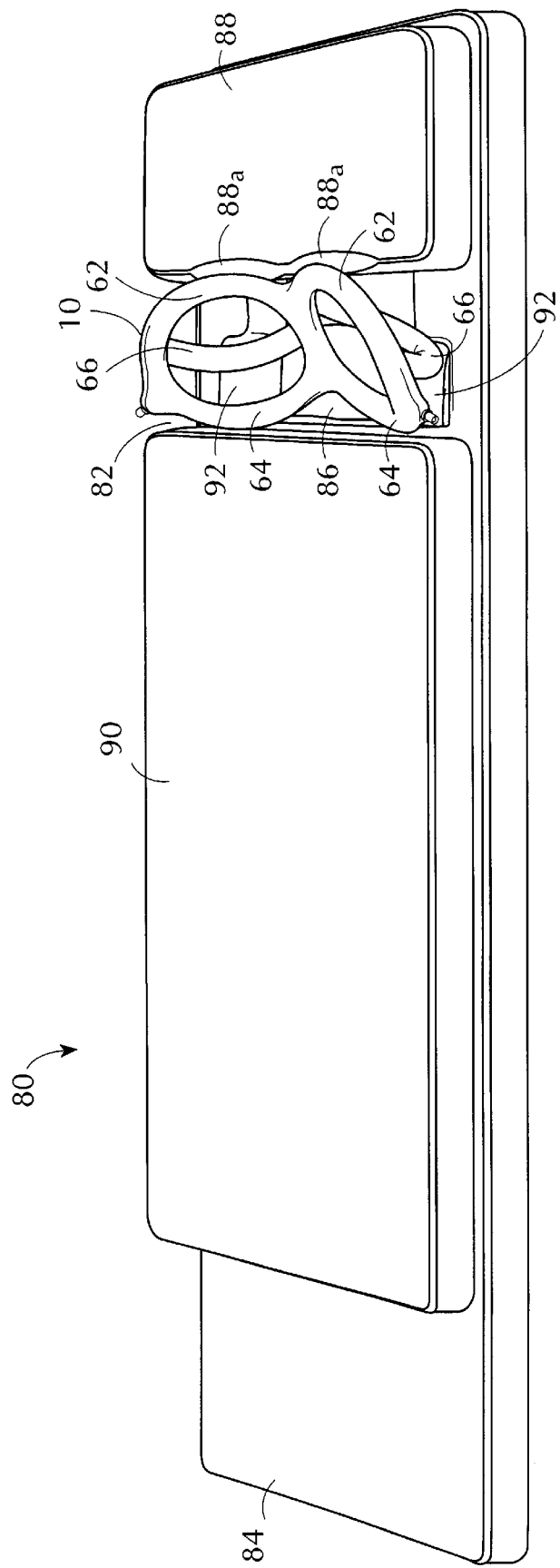
FIG. 9 is a rear perspective view of a cushion arrangement for supporting the patient in a prone position on a patient bed, for use with the antenna of the present invention.

MRI of the breast region of a patient is best performed on pendulous, non-compressed breasts, with the patient in a prone position. FIG. 9 is a rear perspective view of a cushion arrangement 80 for supporting the patient in a prone position on a patient bed, defining a region 82 for receiving the pendulous breasts of the patient and the antenna 10 of the present invention. The arrangement includes a base cushion 84 having a cavity 86, a head cushion 88 and a body cushion 90. The head cushion 88 and body cushion 90 are preferably secured to the base cushion 84 in a desired location by velcro. Other methods for securing the cushions can be used as well, such as straps.

The head cushion 88 preferably includes two recessed sections 88*a* in the rear top corner, to receive and support part of the top portion 62 of the antenna 10. The cavity 86 of the base cushion 84 has two opposing side wall portions 92, downwardly inclined toward the interior of the cavity 86, for supporting the second depending loop 66 of the antenna 10 in a desired position. The first depending loop 64 can bear against the rear wall 98 of the base cushion 84, or the top front corner 98*a* of the base cushion 84, dependent upon the desired position of the antenna 10 with respect to the breasts of a patient, as shown in FIGS. 10 and 11.

The antenna 10 is preferably positioned such that the top portion 62 of the antenna 10, which includes the primary coil segment 12', the windings 22, 24 and portions 18*a*, 18*b* and 20*a*, 20*b* of the first winding (see FIG. 6, for example), is adjacent to the chest wall of the woman, in front of the breasts of a prone patient. The preferred orientation of the antenna 10 is a compromise between maximizing the filling factor by encompassing as much breast tissue within the region encompassed by the coils of the antenna 10, and aligning the plane of the antenna coils as closely as possible with the direction of the applied magnetic field, as is known in the art.

FIGS. 10 and 11 are side views of the cushions of FIG. 9, supported on a bed 94, with a portion of the right side wall of the cavity 86 of the base cushion 84 removed, showing the preferred placement of the antenna 10 with respect to a large breasted woman and small breasted woman, respectively. The front and rear walls 96, 98, respectively, of the base cushion are shown. Preferably, the front and rear walls 96, 98 are about 8 inches apart. In FIGS. 10 and 11 and in the following discussion, it is assumed that the direction of the magnetic field is perpendicular to the bed.

The antenna 10 is preferably oriented at an angle of about 30° with respect to the patient bed 94, measured by a line through the top portion 62 and the bottom of the first depending loop 64, as shown in FIG. 10. A substantial portion of the breast tissue is thereby encompassed by the antenna 10, and is close to the antenna coils. While the planes of the first depending loop 64 and the second depending loop 66 are not very closely aligned with the vertical direction of the magnetic field, the large filling factor and close proximity of the coils to the breast tissue enables good sensitivity.

To support the antenna 10 in this position, the top portion 62 of the antenna 10 is positioned in the recesses 88*a* of the head cushion and the bottom of the first depending loop 64 bears against the top front corner 98*a* of the base cushion 84. The sides of the second depending loop 66 are supported by the inclined side walls 92 of the base cushion 84. The center of the antenna 10 may be supported by a cushion 100 which may be inserted into the cavity 86, between the breasts. The body cushion 90 is preferably positioned toward the rear of the base cushion 84, so that the top front corner 98*a* of the base cushion 84 is unobstructed.

The preferred positioning with respect to a small breasted woman is about 45°. While not as much breast tissue is encompassed by the antenna 10 as in the case of a large breasted woman, the planes of the first and second depending loops 64, 66 are more closely aligned with the vertical direction of the magnetic field. The antenna 10, therefore, has good sensitivity beyond the region actually encompassed by the antenna 10. As shown in FIG. 11, the top portion 62 of the antenna 10 is supported in the recesses 88*a*. The second depending loop 66 is supported by the inclined walls 92 and the first depending loop 64 bears against the midpoint of the rear wall 98 of the body cushion 84 for stability. The front wall 91 of the body cushion 84 is preferably aligned with the front wall 98 of the base cushion.

In both cases, the top portion 62 of the antenna is adjacent to the chest region above the breasts, the first depending loop 64 is behind the breast and the second depending loop 66 is slightly behind the breast, beneath the nipple region of the breast. The portions of the secondary coils 14, 16 coils within the top portion 62 of the antenna detects MR signals emitted by the chest and upper breast region of the patient. The portions of the secondary coils 14, 16 within the first depending loop 64 detect MR signals emitted by the lower breast and the portion of the secondary coils 14, 16 within the second depending loop 66 detect MR signals emitted from the nipple region and center portion of the breasts. MR signals are detected from both breasts simultaneously. The MR signals emitted from the breast region of the patient induce voltage signals in the adjacent secondary coils 14, 16. The voltage signals cause current to flow within the secondary coils 14, 16, which generates a magnetic field in the region of the primary coil 12. The magnetic field induces voltage signals in the primary coil, which are provided to the pre-amplifier 54 of the MRI system 50. The primary coil 12 also detects MR signals directly from adjacent regions of the patient.

Figure 12:
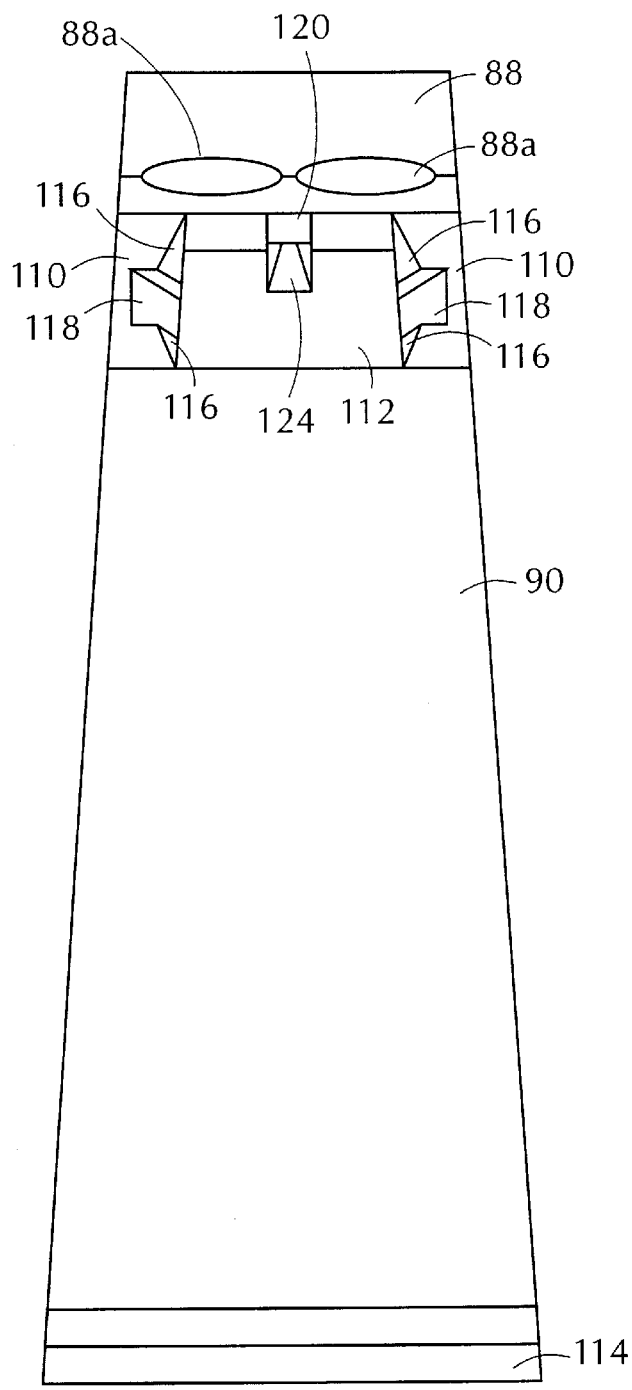
FIG. 12 is a rear perspective view of an alternative cushion arrangement.

FIG. 12 is a rear perspective view of an alternative cushion arrangement, wherein the side walls 110 of the cavity 112 of the base cushion 114 have tapered portions 116 adjacent to the opposing inclined portions 118 of the side walls. The tapered portions 116 are slightly inclined toward the interior of the cavity 112. This arrangement eases insertion of the antenna 10 into position within the cavity 112. An optional cushion 120 for providing additional support for the center of the antenna 10, is shown as well.

Figure 12A:
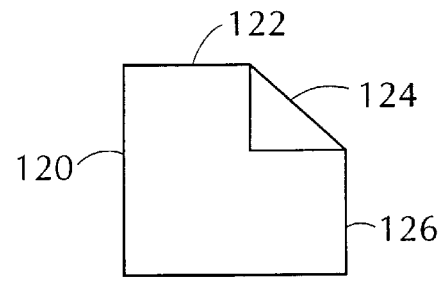
FIG. 12A is a side view of an optional cushion for providing additional support for the antenna of the present invention.

FIG. 12A is a side view of the cushion 120, showing a flat top surface 112, a tapered surface 124, and a rear wall 126. The center of the antenna 10 bears against the tapered surface 124. Such a cushion 120 can be used with the cushion arrangement of FIGS. 9–11, as well.

It has been found that an antenna 10 tuned to a Larmor frequency of about 24.9 MHz has a sensitivity of from about −18 decibel volts ("dbv") to about −20 dbv, within a volume defined by the antenna 10. An antenna tuned to 14.9 MHz has a sensitivity of from about −19 dbv to about −21 dbv. The antenna 10 in accordance with the present invention thereby achieves high, substantially uniform sensitivity over the region of the chest, breast, and nipple of a patient. As mentioned above, sensitivity proximate the chest region is particularly advantageous in detecting tumors in the chest wall.

It will be apparent to those skilled in the art that various modifications may be made to the preferred embodiments of the present invention which have been described and illustrated, without departing from the scope of the present invention, which is defined by the following claims.

I claim:

1. A radio frequency antenna for conducting magnetic resonance imaging studies, comprising:

a tuned primary circuit including at least one primary inductor and at least one primary capacitor connected in series, the primary inductor having the shape of an elongated loop; and first and second tuned secondary circuits, each secondary circuit comprising at least one secondary inductor and at least one secondary capacitor connected in series, the secondary circuits forming first and second closed secondary loops lying substantially within the elongated loop, each secondary loop having at least one portion adjacent to the primary loop to inductively couple the secondary circuits to the primary circuit and at least one portion distanced from the primary loop, the secondary loops each defining a region for receiving a body part.

2. The radio frequency antenna of claim 1, wherein the primary loop is elongated along an axis of elongation, the first and second secondary loops being adjacent to each other along the axis.

3. The radio frequency antenna of claim 2, wherein the primary loop is curved along the axis of elongation, the at least one portion of the first and second secondary loops adjacent to the primary loop substantially following the curvature of the primary loop.

4. The radio frequency antenna of claim 2, wherein the first and second secondary loops are spiral shaped with at least first and second windings.

5. The radio frequency antenna of claim 4, wherein the first and second secondary circuits are mirror images of each other.

6. The radio frequency antenna of claim 5, wherein the portion of each loop distanced from the primary loop is folded along a chord of the first winding.

7. The radio frequency antenna of claim 6, wherein the chord of each of the windings lies substantially along the direction of the axis of elongation of the primary loop.

8. The radio frequency antenna of claim 6, wherein the primary loop has first and second elliptical sections, the first secondary loop lying within the first elliptical section and the second secondary loop lying within the second elliptical section, the first and second secondary loops having a generally elliptical shape following the shape of the respective elliptical section, the major axis of each elliptical section being substantially in the direction of the axis of elongation of the primary loop.

9. The radio frequency antenna of claim 1, further comprising means for electrically connecting the primary circuit to a pre-amplifier of a magnetic resonance imaging system.

10. The radio frequency antenna of claim 9, further comprising means for connecting the primary circuit to a source of radio frequency energy.

11. The radio frequency antenna of claim 1, further comprising means for connecting the primary circuit to a source of radio frequency energy.

12. The radio frequency antenna of claim 1, wherein the primary circuit comprises two primary inductors and two primary capacitors, the primary inductors each having first ends connected in series to a first of the capacitors and second ends connected in series to a second of the capacitors.

13. The radio frequency antenna of claim 1, wherein the primary circuit is critically coupled to each of the secondary circuits.

14. The radio frequency coil of claim 1, wherein the primary loop and the adjacent portions of the secondary loops lie substantially in a spherical plane.

15. A radio frequency antenna for conducting magnetic resonance imaging studies of the breast region of a patient, comprising:

a tuned primary circuit comprising at least one primary coil having an inductance and connected in series to at least one capacitor, the primary coil being elongated along an axis of elongation;

a pair of tuned, adjacent secondary circuits each comprising at least one secondary coil having an inductance and connected in series to at least one capacitor, each of the secondary coils of each secondary circuit lying substantially within the primary coil and being adjacent to each other along the axis of elongation, the secondary coils of each secondary circuit being inductively coupled to the primary coil and having a first portion lying substantially in a first plane and a second portion lying substantially in a second plane intersecting the first plane, the secondary coils each defining a region for receiving one of the breasts of the patient; and means for electrically connecting the primary circuit to a magnetic resonance imaging system.

16. The radio frequency antenna of claim 15 wherein the inductive coupling between the primary and secondary coils is critical coupling.

17. The radio frequency antenna of claim 15, wherein the primary circuit comprises two primary coil segments each having inductance and two primary capacitors, the primary coil segments each having first ends connected in series to a first of the primary capacitors and second ends connected in series to a second of the primary capacitors; and each of the secondary circuits comprises two secondary coil segments each having inductance and two secondary capacitors, the secondary coils segments each having first ends connected in series to a first of the secondary capacitors and second ends connected in series to a second of the secondary capacitors.

18. The radio frequency antenna of claim 17, wherein the primary coil lies substantially in the first plane, each of the secondary coils has a spiral shape and comprises first and second windings, the second winding being substantially in the first plane, adjacent to the primary loop and the first winding having a first portion substantially in the first plane, adjacent to the second winding and a second portion substantially in the second plane.

19. The radio frequency antenna of claim 18, wherein the first winding of each secondary coil is folded along a chord lying generally in the direction of the axis of elongation, to position the first portion of the winding in the second plane.

20. The radio frequency antenna of claim 19, wherein the primary coil has two generally elliptical sections and the first and second secondary coils lie within the first and second elliptical section respectively, the first and second secondary coils having a generally elliptical shape following the shape of the respective elliptical section, the major axis of each elliptical shape lying generally in the direction of the axis of elongation of the primary coil.

21. The radio frequency antenna of claim 20, wherein the primary coil is curved along the axis of elongation and the first plane is curved along the axis of elongation.

22. The radio frequency antenna of claim 21, wherein the primary coil is curved along the direction transverse to the axis of elongation.

23. The radio frequency antenna of claim 22, wherein the angle between the first and second planes is about 30°.

24. A radio frequency receiving antenna for conducting magnetic resonance imaging studies of the breasts of a patient, comprising:

a tuned primary circuit comprising first and second primary inductors and first and second primary capacitors, the first and second primary inductors having first ends connected in series with the first primary capacitor and second ends connected in series with the second primary capacitor forming a primary loop, the primary loop having first and second generally elliptical sections lying substantially in a first spherical plane;

first and second tuned secondary circuits, each comprising first and second secondary inductors and first and second secondary capacitors, the first and second secondary inductors having first ends connected in series to the first capacitor and second ends connected in series to the second capacitor forming first and second closed secondary loops, the first and second closed secondary loops lying within the first and second elliptical sections of the primary loop, respectively, the first and second closed secondary loops being a spiral having first and second windings, the second windings being substantially adjacent to the corresponding elliptical section of the primary loop and lying substantially in the first spherical plane, the first winding having a portion lying substantially in the first spherical plane, adjacent to the second winding, such that the secondary loops are critically inductively coupled to the primary loops, the first winding having a second portion folded along a chord of the first winding such that the second portion is substantially in a second plane intersecting the first spherical plane, the first and second closed loops each defining a region for receiving one of the breasts of the patient; and means for electrically connecting the primary circuit to a preamplifier of a magnetic resonance imaging system.

25. A radio frequency antenna and cushion arrangement for use in magnetic resonance imaging studies of the breast region of a patient, comprising:

an antenna comprising:

a tuned primary circuit comprising at least one primary coil having an inductance and connected in series to at least one capacitor, the primary coil being elongated along an axis of elongation;

a pair of tuned, adjacent secondary circuits each comprising at least one secondary coil having an inductance and connected in series to at least one capacitor, each of the secondary coils of each secondary circuit lying substantially within the primary coil and being adjacent to each other along the axis of elongation, the secondary coils of each secondary circuit being inductively coupled to the primary coil and having a first portion lying substantially in a first plane and a second portion lying substantially in a second plane intersecting the first plane, the secondary coils each defining a region for receiving one of the breasts of the patient; and means for electrically connecting the primary circuit to a magnetic resonance imaging system; and a base cushion having a cavity, the cavity having opposed sided walls, the side walls being downwardly inclined to support a portion of the antenna in a plurality of positions;

the antenna being positioned within the cavity such that the pendulous breasts of a patent in prone position may be received within the secondary coils.

26. The antenna and cushion arrangement of claim 25, further comprising:

a first cushion positionable rearward of the cavity on the top surface of the base cushion for supporting the body portion of the patient;

a second cushion positionable forward of the cavity on the top surface of the base cushion for supporting the head of the patient, the second cushion having a recessed section at an upper rear corner for supporting a second portion of the antenna; and means for connecting the first and second cushions to the top surface of the base cushion.

27. The cushion arrangement of claim 26, further comprising a third cushion for being selectively placed within the cavity, adjacent to the head cushion, for supporting a third portion of the antenna.

* * * * *

UNITED STATES PATENT AND TRADEMARK OFFICE
CERTIFICATE OF CORRECTION

PATENT NO.    :    6,023,166
DATED         :    February 8, 2000
INVENTOR(S)   :    Gregory I. EYDELMAN It is certified that error appears in the above-identified patent and that said Letters Patent is hereby corrected as shown below:

Column 6, line 34, after "line" change "4A–AA" to --4A–4A--;

Column 14, line 57, after "rear" change "comer" to --corner--.

Signed and Sealed this

Twenty-fourth Day of April, 2001

Attest:

NICHOLAS P. GODICI

Attesting Officer    Acting Director of the United States Patent and Trademark Office